(12) United States Patent
Mitchell

(10) Patent No.: US 8,133,367 B1
(45) Date of Patent: Mar. 13, 2012

(54) SPUTTERING SYSTEM AND METHOD USING A LOOSE GRANULAR SPUTTERING TARGET

(75) Inventor: Daniel Bruce Mitchell, Port McNicoll (CA)

(73) Assignee: Raytheon Company, Waltham, MA (US)

( * ) Notice: Subject to any disclaimer, the term of this patent is extended or adjusted under 35 U.S.C. 154(b) by 1087 days.

(21) Appl. No.: 11/503,227

(22) Filed: Aug. 11, 2006

(51) Int. Cl.
*C23C 14/32* (2006.01)
(52) U.S. Cl. .......... 204/298.04; 204/298.12; 204/192.11
(58) Field of Classification Search ............. 204/298.04, 204/192.11, 298.12
See application file for complete search history.

(56) References Cited

U.S. PATENT DOCUMENTS

| | | | |
|---|---|---|---|
| 4,747,922 A | | 5/1988 | Sharp |
| 4,912,087 A | * | 3/1990 | Aslam et al. ................. 505/475 |
| 5,741,404 A | * | 4/1998 | Cathey ..................... 204/192.11 |
| 6,099,982 A | | 8/2000 | Okabe et al. |
| 6,121,178 A | | 9/2000 | Eshima et al. |
| 6,251,233 B1 | * | 6/2001 | Plester et al. ............ 204/192.38 |
| 6,284,013 B1 | | 9/2001 | Shindo et al. |
| 6,500,225 B2 | | 12/2002 | Hasegawa et al. |

FOREIGN PATENT DOCUMENTS

| | | | |
|---|---|---|---|
| JP | 05132395 A | * | 5/1993 |
| JP | 05320898 A | * | 12/1993 |

OTHER PUBLICATIONS

Machine Translation of JP05320898 A to Arimatsu. Published: Dec. 7, 1993.*

* cited by examiner

*Primary Examiner* — Keith Hendricks
*Assistant Examiner* — Jason M Berman
(74) *Attorney, Agent, or Firm* — Christie, Parker & Hale, LLP

(57) ABSTRACT

Sputtering is performed using a sputtering system having a sputtering source having a sputtering medium, a sputtering target positioned so as to be impinged upon by the sputtering medium of the sputtering source, wherein the sputtering target comprises a mass of a first loose granular material, and an open-top vessel in which the mass of the first loose granular material of the sputtering target is received and positioned so that the first loose granular material does not fall out of the open-top vessel by gravity. Some of the first loose granular material is sputtered from the sputtering target, a quantity of a second loose granular material is added to the mass of the first loose granular material in the open-top vessel, and thereafter some of the second loose granular material is sputtered from the sputtering target.

23 Claims, 2 Drawing Sheets

SPUTTERING SYSTEM AND METHOD USING A LOOSE GRANULAR SPUTTERING TARGET

This invention relates to the deposition of layers onto a substrate by sputtering from a sputtering target and, more particularly, to the granular nature of the material of the sputtering target.

BACKGROUND OF THE INVENTION

Many optical, electronic, and other technological fields require the controllable deposition of thin films upon a substrate. A number of processes are known for depositing such thin films. In evaporation processes, for example, a mass of material is heated so that the vapor pressure of the heated material causes it to evaporate from the surface of the material and deposit on a cooler adjacent substrate, forming the thin film.

Sputtering is another technique for depositing a layer of a deposited material onto a surface of a substrate. In sputtering, energetic ions are directed against the surface of a water-cooled plate target formed of the material to be deposited. The energetic ions dislodge and eject atoms of the target material from the surface of the plate target by a mechanical interaction. Some of the ejected atoms deposit onto the surface of the substrate, producing the deposited layer. While the sputtering plate target may be heated to a degree, the sputtering process is distinct from thermally based evaporation processes wherein the atoms are expelled from the surface of material source by thermal energy. The sputtering plate target is produced as a solid plate or piece by one of several techniques.

The target initially has a planar surface. As sputtering proceeds, experience has shown that the removal from the plate target surface of the material to be deposited is not uniform. Instead, the initially planar surface of the plate target tends to become dished in profile, corresponding somewhat to the energy and mass distribution of the sputtering beam. As the surface of the plate target becomes ever more dished, the spatial distribution of the ejected atoms changes. The result is that the deposition on the surface of the substrate varies over time. This variation is undesirable, because in many cases the deposition must be highly precise in respect to the composition and thickness of the deposited layers.

The dishing of the plate target surface is also undesirable economically, because eventually the dished target surface punches through the bottom of the sputtering plate target, when only a fraction of the material of the sputtering plate target has been sputtered. The remainder of the sputtering plate target is discarded or recycled at a substantial reduction in value. Because many types of specialty sputtering plate targets are expensive, this material wastage represents a significant addition to the cost of the final-product.

There is a need for an improved approach to sputtering that reduces or, ideally, eliminates the technical and economic problems associated with the present sputtering approach. The present invention fulfills this need, and further provides related advantages.

SUMMARY OF THE INVENTION

The present approach provides a technique for sputtering in which the macroscopic surface shape of the sputtering target remains substantially planar. The technique thus avoids the dishing of the sputtering target that can have an adverse effect on the deposition. Full utilization of the target material is achieved with no wasted target material. The geometry of the sputtering system is constrained, but most sputtering applications may be performed without adverse effects.

In accordance with the invention, a sputtering system comprises a sputtering source having a sputtering medium, and a sputtering target positioned so as to be impinged upon by the sputtering medium of the sputtering source. The sputtering source is preferably, but not necessarily, an ion beam sputtering source, but it may be any operable type of sputtering source. The sputtering target comprises a mass of a first loose granular material. The sputtering system further includes an open-top vessel in which the mass of the first loose granular material of the sputtering target is received and positioned so that the first loose granular material does not fall out of the open-top vessel by gravity. As used herein, a "loose" granular material is made of granules or particles that are not intentionally bonded to each other prior to placement in the open-top vessel, and therefore can move easily relative to each other.

The first loose granular material may be a pure material, a prealloyed alloy material, or a non-prealloyed alloy material. In the case of the prealloyed alloy material, each granule has the net alloy composition that is to be deposited. In the case of the non-prealloyed alloy material, the granules have different compositions, but their net composition is the composition to be deposited. The use of non-prealloyed granules allows compositions to be sputtered that cannot be readily made into conventional sputtering targets.

The granular material is in the physical form of small pieces that are preferably generally, but not necessarily exactly, equiaxed. The granular material may have a regular or irregular shape. The granular material preferably has a maximum dimension of from about 3 millimeters to about 6 millimeters. The open-top vessel has a depth that is greater than the maximum dimension of any of the granules, so that there are at least several granules overlying each other from the bottom to the top of the open-top vessel. Preferably, the open-top vessel depth is sufficient so that at least three layers of the granular material are present at the conclusion of the deposition operation.

One of the operational concerns is the overheating of the mass of loose granules. To avoid overheating, the heat input to the mass of loose granules may be limited, and/or heat may be removed from the mass of loose particles as rapidly as possible. One preferred approach to reducing the heat input is to use an ion beam sputtering source which has a relatively low heat input to the sputtering target. Another approach is to remove excessive heat. For this purpose, the open-top vessel holding the mass of loose granules itself is preferably cooled, most preferably water cooled or gas-expansion cooled by cooling lines running through the walls. A third approach is to operate the sputtering source for relatively short periods of time, permitting the granular material to cool between active sputtering periods. This latter approach is feasible where there are multiple open-toped vessels that are operated alternatively, or where the deposited layer is thin. Desirably, the first loose granular material remains fully solid during evaporation, although there may be some melting.

The sputtering system normally further includes a deposition substrate positioned such that sputtered first loose granular material from the open-top vessel is deposited upon the deposition substrate, forming a deposited layer. Because practical applications often require the deposition of multiple deposited layers of differing compositions, the sputtering system may include multiple open-top vessels, each containing a different sputtering target in the form of different compositions of loose granular material. (Some of the sputtering targets may be conventional sputtering targets, but at least one of the sputtering targets is a granular-material sputtering target as described herein.) These different sputtering targets are typically operated alternatively, to sequentially deposit different layers of different compositions.

The sputtering system typically includes a vacuum enclosure having an interior in which the sputtering source, the sputtering target, and the open-top vessel are received. A vacuum pump is operable to evacuate the interior of the vacuum enclosure.

One of the advantages of the present approach is that additional granular material may be added to replenish the open-top vessel as the first loose granular material is depleted by sputtering. The additional granular material is desirably added so as to keep the level of the top of the mass of granular material generally planar. The dishing effect observed with conventional sputtering targets is thereby minimized or avoided, resulting in a more regular and predictable deposition process. The total amount of material depletion in a single sputtering operation is normally relatively small, and the replenishing of the open-top vessel may be accomplished between sputtering operations, when the vacuum enclosure is opened to remove the completed substrates and load new substrates for deposition.

In other situations, deposited substrates may be removed and new substrates loaded without breaking the vacuum. In this case, there can be provided a source of a second loose granular material positioned to controllably add a quantity of the second loose granular material to the mass of the first loose granular material in the open-top vessel, without opening the vacuum enclosure. In either case, the additional or second loose granular material may have the same composition as the first loose granular material, which is normally the case, or it may have a different composition. The capability of adding additional granular material to be sputtered to the open-top vessel allows all of the granular material to be eventually used for sputtering, unlike conventional sputtering processes wherein only a fraction, often less than half, of the plate sputtering target is consumed before the dishing effect causes the performance of the sputtering target to become unacceptable.

A method for performing sputtering comprises the steps of providing a sputtering system comprising a sputtering source having a sputtering medium, a sputtering target positioned so as to be impinged upon by the sputtering medium of the sputtering source, and an open-top vessel in which the mass of the first loose granular material of the sputtering target is received and positioned so that the first loose granular material does not fall out of the open-top vessel by gravity. The sputtering target comprises a mass of a first loose granular material. Some of the first loose granular material is sputtered from the sputtering target. A quantity of a second loose granular material is thereafter added to the mass of the first loose granular material in the open-top vessel. Some of the second loose granular material is thereafter sputtered from the sputtering target. Other compatible features discussed herein may be used in conjunction with this method.

The present approach uses a loose granular sputtering target instead of the conventional plate-like sputtering target. The loose granular sputtering target can be replenished to avoid dishing of the surface of the sputtering target. The replenishment also allows complete utilization of the material to be deposited, rather than discarding partially used conventional sputtering targets, an economic advantage where the sputtered material is expensive. The present approach does require that the open-top vessel be positioned so that the granular material does not spill out of the open-top vessel, which also limits the positioning of the deposition substrate.

Generally, the open-top vessel must face upwardly, and the deposition substrate must face downwardly. This geometrical limitation is not a significant obstacle in most circumstances.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
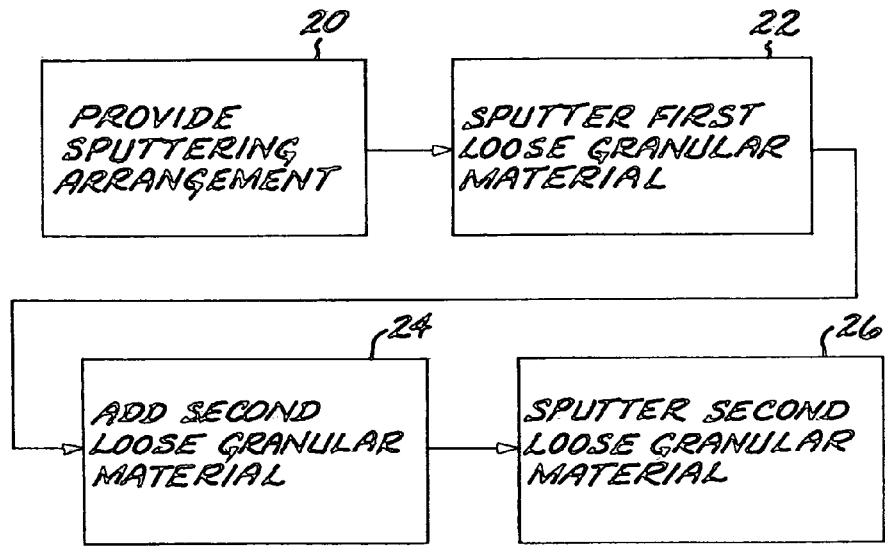
FIG. 1 is a block flow diagram of a method for performing sputtering.
Figure 2:
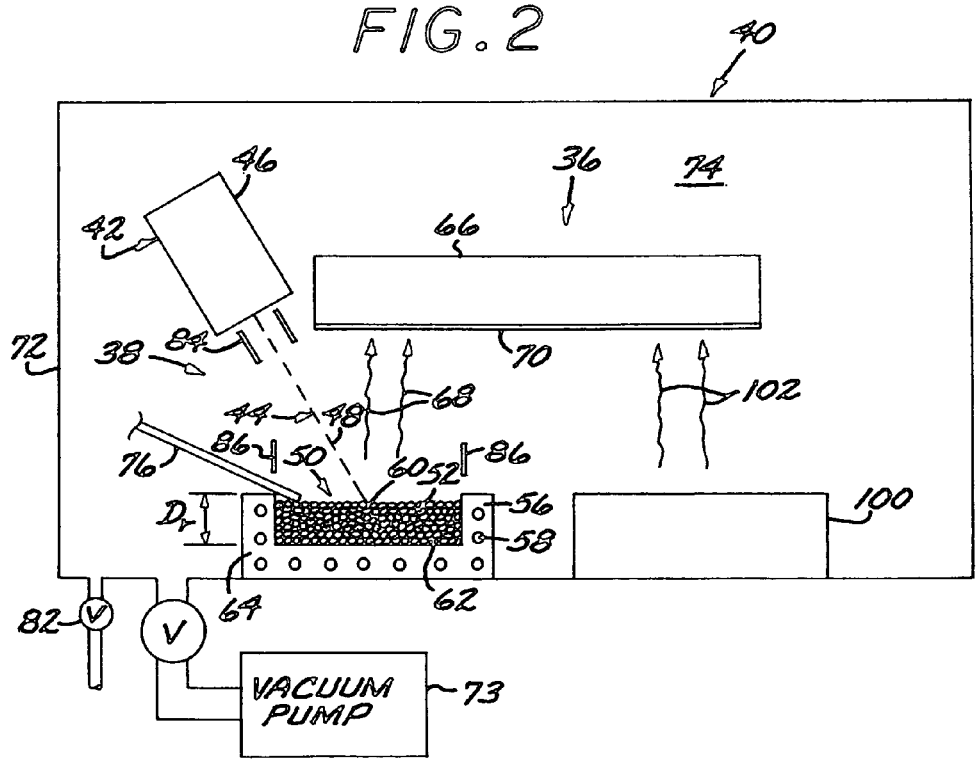
FIG. 2 is a schematic elevational view, partly in section, of a sputtering system according to the present approach.

FIG. 1 depicts a preferred embodiment of a method for performing sputtering. The method includes providing a sputtering arrangement and associated sputtering system, step 20. A preferred embodiment of the sputtering system 40 is illustrated in FIG. 2. The sputtering system 40 has at least one deposition source 36, which in this instance is a sputtering deposition source 38. The sputtering deposition source 38 includes a sputtering source 42 having a sputtering medium 44. The sputtering medium 44 is an energized medium that causes sputtering of a contacted target. The sputtering source 42 is preferably an ion beam sputtering source 46, and the sputtering medium 44 is preferably an ion beam 48. The reasons for preferring an ion beam sputtering source 46 will be discussed subsequently.

The sputtering system 40 further includes a sputtering target 50 positioned so as to be impinged upon by the sputtering medium 44 of the sputtering source 42. The sputtering target 50 is a mass of a first loose granular material 52. The mass of granular material 52 is a plurality of "granules", which are small particles or pellets. As used herein, a "loose" granular material is made of granules or particles that are not intentionally bonded to each other prior to placement in the open-top vessel, and therefore can move easily relative to each other. That is, the loose granular material is free flowing, and may be poured even though it is a solid. There may be some minor bonding of the granules to each other during the heating of the sputtering target 50, or, in extreme cases, some melting of the granules during the deposition operation. The sputtering target 50 of loose granular material is distinguished from sputtering targets that are formed of particles or powders that are intentionally sintered, hot pressed, or otherwise intentionally bonded together prior to the sputtering operation. The first loose granular material may comprise, for example, a pure material, a prealloyed alloy material, or a non-prealloyed alloy material.

Figure 3:
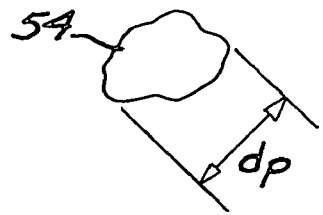
FIG. 3 is an elevational view of a representative granule.

FIG. 3 illustrates, by way of example, one of the granules 54 of the first loose granular material 52. The granules 54 that make up the first loose granular material 52 need not be of the same size and shape, and typically are of a range of sizes and shapes. The granules 54 are preferably generally roughly equiaxed (i.e., have approximately the same dimensions in three axes), although there may be a degree of non-equiaxed character to the granules 54. On the other hand, it is preferred that the granules 54 be of approximately the same size and shape, to ensure uniform sputtering performance. The granules 54 of the first loose granular material 52 preferably each have a maximum dimension $d_p$ of from about 3 millimeters to about 6 millimeters. Larger and smaller granules are operable to some degree. However, if the granules are smaller than about 3 millimeters, they tend to move excessively under the mechanical impingement action of the sputtering medium 44, and if they are larger than about 6 millimeters, they begin to perform individually in a manner similar to the conventional plate sputtering target.

The sputtering system 40 further includes an open-top vessel 56 in which the mass of the first loose granular material 52 of the sputtering target 50 is received. The open-top vessel 56 is optionally, but preferably, cooled as for example by water cooling channels 58 running through its walls. The open-top vessel 56 and the granular first loose granular material 52 received therein are cooperatively oriented and positioned so that the first loose granular material 52 does not fall out of the open-top vessel by gravity. Usually, this means that a top surface 60 of the first loose granular material 52 that forms the sputtering target 50 is oriented horizontally (i.e., perpendicular to a radius of the earth). Conventional plate-like sputtering targets may be oriented at any angle, but the present sputtering target 50 must be oriented so that the first loose granular material 52 does not fall out of the open-top vessel 56.

The first loose granular material 52 is received in a contained volume 62 of the first open-top vessel that is defined by its walls 64. The contained volume 62 of the open-top vessel preferably has a depth $D_v$ that is at least about three times the maximum dimension $d_p$ of the granules 54 of the first loose granular material 52. That is, the depth $D_v$ is sufficiently large to allow a number of layers of the granules 54. Otherwise, there is an increased risk of a dishing failure of the sputtering target, as will be described subsequently.

The sputtering system 40 further includes a deposition substrate 66 positioned such that sputtered first loose granular material 68 sputtered from the granules 54 in the open-top vessel 56 is deposited upon the deposition substrate 66 as a deposited layer 70. The deposited layer 70 gradually thickens over time as the sputtering continues.

The path and trajectory of the sputtering medium 44 may be controlled. One approach is to provide a controllable magnetic field source 84 that can affect the path and trajectory of the sputtering medium 44 over part or all of its travel from the sputtering source 42 to the open-top vessel 56. Similarly, the volume over the open-top vessel 56 may have a magnetic field applied by the same magnetic field source 84 or a separate magnetic field source 86, to control the sputtering environment at the top surface 60.

The sputtering is preferably conducted in a vacuum environment. The sputtering system 40 preferably further includes a vacuum enclosure 72 having an interior 74 in which the sputtering source 42, the sputtering target 50, the open-top vessel 56, and the deposition substrate 66 are received. A vacuum pump 73 is operable to evacuate the interior 74 of the vacuum enclosure 72. There may also be a backfill valve 82 to partially backfill the interior 74 of the vacuum enclosure 72 with air, an inert gas, or a reactive gas.

Figure 4:
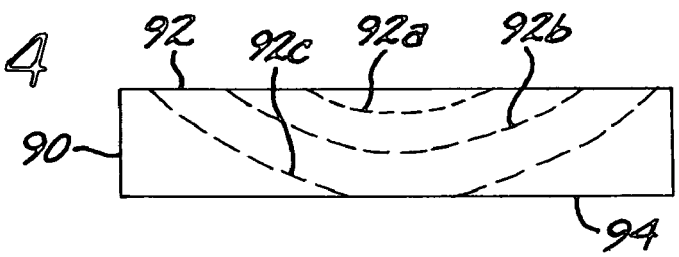
FIG. 4 is a schematic elevational illustration of the dishing of a conventional sputtering target.
Figure 5:
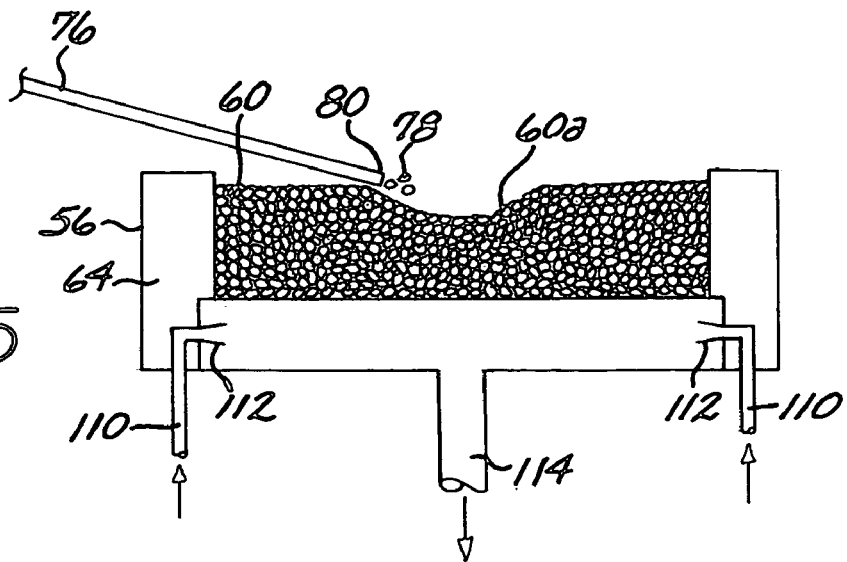
FIG. 5 is a schematic elevational illustration, partly in section, of the effect of replenishing of the open-top vessel in the present approach.

It is an advantage of the present approach that additional loose granular material may be added to the contained volume 62 of the open-top vessel 56. FIGS. 4-5 illustrate the reason for making such an addition. FIG. 4 depicts a plate-type sputtering target 90 that is not within the scope of the present invention. As material is sputtered from the plate-type sputtering target 90, the initially flat upper surface 92 of the plate-type sputtering target 90 becomes eroded away and dish shaped, as illustrated by the ever-increasingly dished progression of surface profiles 92a, 92b, and 92c in FIG. 4. Eventually, as illustrated for the surface profile 92c, the plate-type sputtering target is locally thinned so that it punches through to a back surface 94 of the plate-type sputtering target 90. The dishing of the upper surface 92 changes the pattern of the evaporated material over time, a disadvantage if the deposition must be precisely controlled. Additionally, prior to the punch-through to the back surface 94, the plate-type sputtering target 90 must be removed from service, and is typically treated as scrap material whose value per pound is considerably less than that of the whole plate-type sputtering target 90.

In the present approach depicted in FIG. 5, when the top surface 60 begins to dish, as illustrated at the surface profile 60a, additional granular material may be added to restore the top surface 60 to its original substantially flat shape. The addition of more material also has the advantage that none of the sputtering target is discarded as scrap of reduced value. The additional granular material may be added between runs, when the vacuum enclosure 72 is opened for interior access. The additional granular material may instead be added without opening the vacuum enclosure 72, using a source 76 of a second loose granular material 78 positioned to controllably add a quantity of the second loose granular material 78 to the mass of the first loose granular material 52 in the open-top vessel 56. The source 76 of the second loose granular material 78 may be, for example and as illustrated, an inclined chute whose output end 80 is movable to overlie the dished portion of the first loose granular material 52. The second loose granular material 78 is added to the input end of the chute to travel down to the output end 80 and thence into the open-top vessel 56. The second loose granular material 78 is normally of the same type and composition as the first loose granular material 52, but it need not be so.

Returning to the process steps of FIG. 1, some of the first loose granular material 52 is thereafter sputtered, step 22, from the sputtering target 50 to be deposited onto the deposition substrate 66 to produce the deposited layer 70. In the preferred approach, the ion beam 48 is directed from the ion beam sputtering source 46 onto the top surface 60 of the granular-material sputtering target 50. During the sputtering step 22, it is preferred that the first loose granular material 52 is and remains fully solid. There may be some isolated melting of the first loose granular material 52, but that is not preferred.

To sputter the first loose granular material 52 without melting it, heat input to the first loose granular material 52 is minimized, and heat extraction from the first loose granular material 52 is maximized. To minimize the heat input, it is preferred that the sputtering source 42 produce minimal heat input. The ion beam sputtering source 46 having the sputtering medium 44 as an ion beam 48 is preferred. Sputtering wherein an ion cloud is produced over at the top surface 60 of the sputtering target 50 has a greater heat input. To maximize the heat output, the open-top vessel 56 is preferably cooled as illustrated.

Heat is removed through the water cooling of the open-top vessel 56. Techniques other than water cooling may be used to remove heat from the open-top vessel 56. FIG. 5 illustrates one such alternative heat-removal approach. In this approach, compressed gas 110 is piped to the open-top vessel 56, and then expanded through a nozzle 112, such as an expansion nozzle operating by the Joule-Thomson effect, contained within the interior of the walls 64 of the open-top vessel 56, and conducted away through a vent 114. The expanding gas removes heat from the open-top vessel 56, thereby cooling it.

The sputtering step 22 may be the final step of the deposition processing in the event that no second loose granular material 78 is to be added to the open-top vessel 56. However, where there is such an addition, further steps may be performed wherein a quantity of the second loose granular material 78 is added to the mass of the first loose granular material 52 in the open-top vessel 56, step 24. Thereafter, some of the second loose granular material 78 is sputtered from the sputtering target, step 26.

The sputtering deposition source 38 may be the only deposition source in the vacuum enclosure 72, or there may be other deposition sources as well. In FIG. 2, a second deposition source 100 is illustrated. The second deposition source 100 may be of any operable type, and is illustrated in a generic form without detail. For example, the second deposition source 100 may be another sputtering deposition source 38 of the same type as described herein, using the same granular material or a different granular material. The alternative operation of the two sputtering deposition sources 38 and 100 allows the non-operating deposition source to cool. It may instead be, for example, a thermal evaporation source, an electron-beam deposition source, or a plasma-assist deposition source. The second deposition source 100 may be positioned and operated to deposit its deposited material onto the deposition substrate 66 simultaneously with the sputtering deposition source 38, or it may be positioned and operated to deposit its deposited material 102 onto the deposition substrate 66 at a different time. For example, the deposition sources 38 and 100 may be operated alternatively to deposit alternating layers of different materials onto the deposition substrate 66. The deposition substrate 66 and the deposition sources 38 and 100 may be stationary with respect to each other, or they may be movable with respect to each other using structures such as slides or turntables. There may also be shutters, field-producing devices, temperature-measuring devices, deposition monitors, and other devices commonly used in deposition processes.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A sputtering system comprising
a sputtering source having a sputtering medium;
a sputtering target positioned so as to be impinged upon by the sputtering medium of the sputtering source, wherein the sputtering target comprises a mass of a first loose granular material wherein each granule has a longest dimension from about 3 millimeters to about 6 millimeters; and
an open-top vessel in which the mass of the first loose granular material of the sputtering target is received and positioned so that the first loose granular material does not fall out of the open-top vessel by gravity.

2. The sputtering system of claim 1, wherein the sputtering source is an ion beam sputtering source.

3. The sputtering system of claim 1, wherein the first loose granular material comprises a pure material.

4. The sputtering system of claim 1, wherein the first loose granular material comprises a prealloyed alloy material.

5. The sputtering system of claim 1, wherein the first loose granular material comprises a non-prealloyed alloy material.

6. The sputtering system of claim 1, wherein the first loose granular material is fully solid.

7. The sputtering system of claim 1, wherein the open-top vessel is cooled.

8. The sputtering system of claim 1, wherein the open-top vessel is water cooled.

9. The sputtering system of claim 1, further including
a deposition substrate positioned such that sputtered first loose granular material from the open-top vessel is deposited upon the deposition substrate.

10. The sputtering system of claim 1, further including
a vacuum enclosure having an interior in which the sputtering source, the sputtering target, and the open-top vessel are received, and
a vacuum pump operable to evacuate the interior of the vacuum enclosure.

11. The sputtering system of claim 1, further including
a vacuum enclosure having an interior in which the sputtering source, the sputtering target, and the open-top vessel are received,
a vacuum pump operable to evacuate the interior of the vacuum enclosure, and
a source of a second loose granular material positioned to controllably add a quantity of the second loose granular material to the mass of the first loose granular material in the open-top vessel, without opening the vacuum enclosure.

12. A method for performing sputtering, comprising the steps of providing a sputtering system comprising
a sputtering source having a sputtering medium,
a sputtering target positioned so as to be impinged upon by the sputtering medium of the sputtering source, wherein the sputtering target comprises a mass of a first loose granular material and wherein each granule has a longest dimension from about 3 millimeters to about 6 millimeters; and
a cooled open-top vessel in which the mass of the first loose granular material of the sputtering target is received and positioned so that the first loose granular material does not fall out of the open-top vessel by gravity; thereafter
sputtering some of the first loose granular material from the sputtering target; thereafter
adding a quantity of a second loose granular material to the mass of the first loose granular material in the open-top vessel; and thereafter
sputtering some of the second loose granular material from the sputtering target.

13. The sputtering system of claim 12, wherein the sputtering source is an ion beam sputtering source.

14. The sputtering system of claim 12, wherein the first loose granular material comprises a prealloyed alloy material.

15. The sputtering system of claim 12, further including
a deposition substrate positioned such that sputtered first loose granular material from the open-top vessel is deposited upon the deposition substrate.

16. The sputtering system of claim 12, further including
a vacuum enclosure having an interior in which the sputtering source, the sputtering target, and the open-top vessel are received, and
a vacuum pump operable to evacuate the interior of the vacuum enclosure.

17. A sputtering system comprising
a sputtering source having a sputtering medium;
a sputtering target positioned so as to be impinged upon by the sputtering medium of the sputtering source, wherein the sputtering target comprises a mass of a first loose granular material and wherein each granule has a longest dimension from about 3 millimeters to about 6 millimeters;

an open-top vessel in which the mass of the first loose granular material of the sputtering target is received and positioned so that the first loose granular material does not fall out of the open-top vessel by gravity; and means for affecting the path and/or trajectory of the sputtering medium.

18. The sputtering system of claim 17 wherein said means for affecting the path of the sputtering medium is a controllable magnetic field source.

19. The sputtering system of claim 18 further including means for controlling the sputtering environment at a top of said vessel.

20. The sputtering system of claim 19 wherein said means for controlling the sputtering environment at a top of said vessel is said controllable magnetic field source.

21. The sputtering system of claim 17 further including means for controlling the sputtering environment at a top of said vessel.

22. The sputtering system of claim 21 wherein said means for controlling the sputtering environment at a top of said vessel is a controllable magnetic field source.

23. A sputtering system comprising
a sputtering source having a sputtering medium;
a sputtering target positioned so as to be impinged upon by the sputtering medium of the sputtering source, wherein the sputtering target comprises a mass of a first loose granular material and wherein each granule has a longest dimension from about 3 millimeters to about 6 millimeters;
an open-top vessel in which the mass of the first loose granular material of the sputtering target is received and positioned so that the first loose granular material does not fall out of the open-top vessel by gravity; and
means for adding a quantity of a second loose granular material to the mass of the first loose granular material in the open-top vessel during a sputtering operation.

* * * * *